United States Patent
Yu et al.

(10) Patent No.: US 10,431,671 B2
(45) Date of Patent: Oct. 1, 2019

(54) FIN FIELD-EFFECT TRANSISTOR

(71) Applicant: Semiconductor Manufacturing International (Shanghai) Corporation, Shanghai (CN)

(72) Inventors: Xiaopeng Yu, Shanghai (CN); Youfeng He, Shanghai (CN); Zhengling Chen, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 15/835,081

(22) Filed: Dec. 7, 2017

(65) Prior Publication Data

US 2018/0097090 A1    Apr. 5, 2018

Related U.S. Application Data

(62) Division of application No. 14/712,533, filed on May 14, 2015, now Pat. No. 9,871,120.

(30) Foreign Application Priority Data

Jun. 26, 2014  (CN) .......................... 2014 1 0294769

(51) Int. Cl.
| | |
|---|---|
| *H01L 29/78* | (2006.01) |
| *H01L 29/66* | (2006.01) |
| *H01L 21/02* | (2006.01) |
| *H01L 21/3065* | (2006.01) |
| *H01L 21/308* | (2006.01) |
| *H01L 21/311* | (2006.01) |

(Continued)

(52) U.S. Cl.
CPC .... *H01L 29/66795* (2013.01); *H01L 21/0217* (2013.01); *H01L 21/0228* (2013.01); *H01L 21/02211* (2013.01); *H01L 21/02326* (2013.01); *H01L 21/02337* (2013.01); *H01L 21/3065* (2013.01); *H01L 21/3086* (2013.01); *H01L 21/31122* (2013.01); *H01L 29/785* (2013.01); *H01L 21/76224* (2013.01); *H01L 21/823431* (2013.01); *H01L 29/7854* (2013.01)

(58) Field of Classification Search
CPC .................... H01L 29/66795–29/66818; H01L 29/785–29/7856; H01L 2029/7857; H01L 2029/7858; H01L 21/823431; H01L 21/823821; H01L 27/0886

See application file for complete search history.

(56) References Cited

U.S. PATENT DOCUMENTS

| | | | |
|---|---|---|---|
| 7,678,651 B2 | 3/2010 | Nam | |
| 2008/0099830 A1* | 5/2008 | Lue | .................... G11C 16/0466 257/324 |

(Continued)

*Primary Examiner* — Eric A. Ward

(74) *Attorney, Agent, or Firm* — Anova Law Group, PLLC

(57) ABSTRACT

A method is provided for fabricating fin field-effect transistors. The method includes providing a substrate. The method also includes forming a plurality of fins on a surface of the substrate. Further the method includes forming a transitional layer having atoms identical to atoms of the fins on side and top surfaces of the plurality of fins by a deposition process. Further, the method also includes performing an oxidation process to convert the transitional layer and a surface portion of the fins into a dielectric material to form a gate dielectric layer on the plurality of fins.

18 Claims, 4 Drawing Sheets

(51) Int. Cl.
*H01L 21/8234* (2006.01)
*H01L 21/762* (2006.01)

(56) References Cited

U.S. PATENT DOCUMENTS

| | | |
|---|---|---|
| 2010/0267238 A1 | 10/2010 | Johnson et al. |
| 2011/0049599 A1 | 3/2011 | Taketani |
| 2014/0061780 A1 | 3/2014 | Son et al. |
| 2014/0117462 A1 | 5/2014 | Cheng et al. |
| 2014/0120691 A1 | 5/2014 | Lee et al. |
| 2014/0273524 A1 | 9/2014 | Nguyen et al. |
| 2015/0200127 A1 | 7/2015 | Chuang et al. |
| 2015/0279974 A1 | 10/2015 | Godet et al. |

\* cited by examiner

FIN FIELD-EFFECT TRANSISTOR

CROSS REFERENCE TO RELATED APPLICATIONS

This application is a divisional of U.S. patent application Ser. No. 14/712,533, filed on May 14, 2015, which claims the priority of Chinese patent application No. 201410294769.9, filed on Jun. 26, 2014, the entirety of all of which is incorporated herein by reference.

FIELD OF THE INVENTION

The present invention generally relates to the field of semiconductor manufacturing technology and, more particularly, relates to fin field-effect transistors (FinFETs) and fabrication processes thereof.

BACKGROUND

With the continuous development of semiconductor technology, the technical node of the semiconductor process has become smaller and smaller by following the Moore's law. In order to adapt to the shrinking of the technical node, the channel length of MOSFETs has to be continuously shrunk. The shrinkage of the channel length brings up the advantages of increasing the device density; and increasing the switch speed of the MOSFET, etc.

However, with the continuous shrinking of the channel length of the semiconductor device, the distance between the source region of the device and the drain region of the device is also correspondingly reduced. The decreased distance between the source region and the drain region may cause the control ability of the gate structure to the channel to be weakened; and the pinch-off of the gate structure to the channel may become more and more difficult. Thus, the sub-threshold leakage phenomenon, i.e., the short-channel effects (SCEs), may easily happen.

Therefore, in order to adapt to the requirements for shrinking the semiconductor devices with a certain ratio, the semiconductor process has gradually switched from planar MOSFETs to three-dimensional transistors which have better performance. For example, fin-field effect transistors (FinFETs) have been developed as the three-dimensional transistors. In a FinFET, the gate structure may at least control the ultra-thin body (Fin) from two sides, thus the control ability of the gate structure to the channel may be significantly greater than the control ability of the gate structure in a planar MOSFET; and the SCEs may be better suppressed. Comparing with other devices, FinFETs may have a better compatibility with the existing fabrication methods of integrated circuits.

However, the electrical properties of the FinFETs formed by existing methods may need further improvements. The disclosed device structures and methods are directed to solve one or more problems set forth above and other problems.

BRIEF SUMMARY OF THE DISCLOSURE

One aspect of the present disclosure includes a method for fabricating fin field-effect transistors. The method includes providing a substrate. The method also includes forming a plurality of fins on a surface of the substrate. Further, the method includes forming a transitional layer having atoms identical to atoms of the fins on side and top surfaces of the plurality of fins by a deposition process. Further, the method also includes performing an oxidation process to convert the transitional layer and a surface portion of the fins into a dielectric material to form a gate dielectric layer on the plurality of fins.

Another aspect of the present disclosure includes a fin field-effect transistor (FinFET). The FinFET includes a substrate. The FinFET also includes a fin formed on a surface of the substrate. Further, the FinFET includes a liner oxide layer formed on the surface of the substrate at both sides of the fin and an isolation layer formed on a surface of the liner oxide layer. Further, the FinFET also includes a gate dielectric layer formed by oxidizing a transitional layer and a surface portion of the fin formed on the surface of the fin. Further, the FinFET also includes a gate electrode layer formed on a surface of the gate dielectric layer and doping regions formed in the fin at both sides of the gate electrode layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
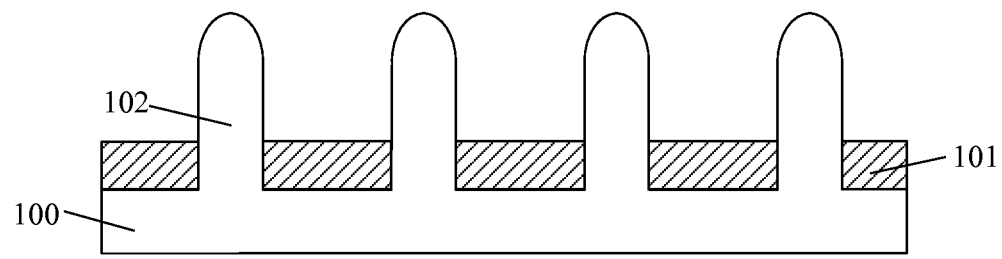
FIGS. 1-2 illustrate semiconductor structures corresponding to certain stages of an existing fabrication method of FinFETs.
Figure 2:
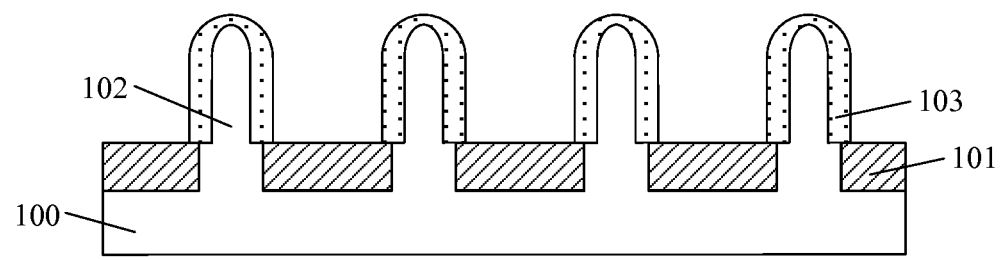

FIGS. 1-2 illustrate semiconductor structures corresponding to certain stages of an existing fabrication method of FinFETs. As shown in FIG. 1, the method may include providing a substrate 100; and forming a plurality of fins 102 on the surface of the substrate 100. Further, a plurality of isolation layers 101 may be formed on the surface of the substrate 100 between adjacent fins 101. Further, as shown in FIG. 2, the method may also include forming the gate dielectric layer 103 on the top surfaces and the side surfaces of the fins 101 by an oxidation process.

The oxidation process may be a furnace oxidation process, or an in-situ steam generation oxidation process, etc. The gate dielectric layer 103 formed by such oxidation processes may have a significantly dense contact with the fins 102, thus the interface defects between the gate dielectric layers 101 and the fins 102 may be prevented; and the leakage current issue caused by the interface defects may be avoided.

When the fins 102 are made of silicon, the gate dielectric layer 103 may be made silicon oxide. The gate dielectric layer 103 may be formed by oxidizing a portion of the fins 103. If one unit silicon oxide is obtained, it may need to oxidize 0.45 unit silicon, thus when the gate oxide layer 103 is formed by oxidizing the fins 102, the material of the fins 102 may be significantly consumed. Thus, the size of the fins 102 may be significantly reduced after forming the gate dielectric layer 103. When the size of the semiconductor device is continuously shrunk, the problems caused by the size reduction of the fins 102 may become more and more severe, the electrical properties of the FinFETs may be significantly affected and, in certain circumstances, the FinFETs may fail.

Further, the fins 102 may be formed by etching the substrate 100, the crystal orientation of the side surface of the fin 102 may be [111] and the crystal orientation of the top surface of the fin 102 may be [110]. When the furnace oxidation process or the ISSG oxidation process is used to oxidize the fins 102, the oxidation rate at different crystal orientation may be different. For example, the oxidation rate to the [111] crystal orientation may be greater than the oxidation rate to the [100] crystal orientation. Thus, the thickness of the gate dielectric layer 103 formed by oxidizing the fin 102 may be uneven. Specifically, the thickness of the gate dielectric layer 103 on the top surfaces of the fins 102 may be smaller than the thickness of the gate dielectric layer 103 on the side surfaces of the fins 102. Such a none-uniformity of gate dielectric layer 103 may also affect the electrical properties of the FinFETs. According to the disclosed methods and the device structures, the size reduction issue the fins, the none-uniformity issue of the gate dielectric layer and other related issues may be solved by forming a transition layer on the side surfaces and the top surfaces of the fins of FinFETs before forming the gate dielectric layer.

Figure 8:
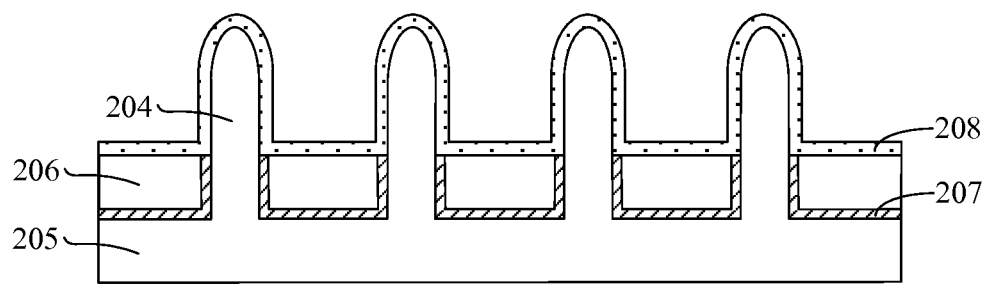
Figure 9:
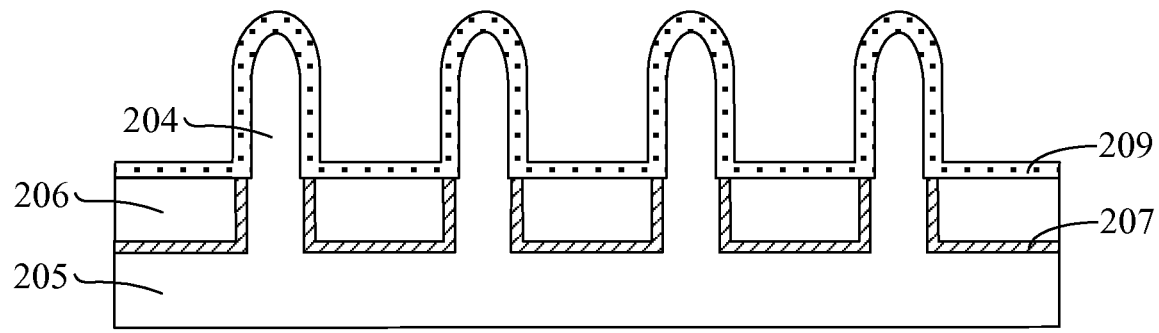
Figure 10:
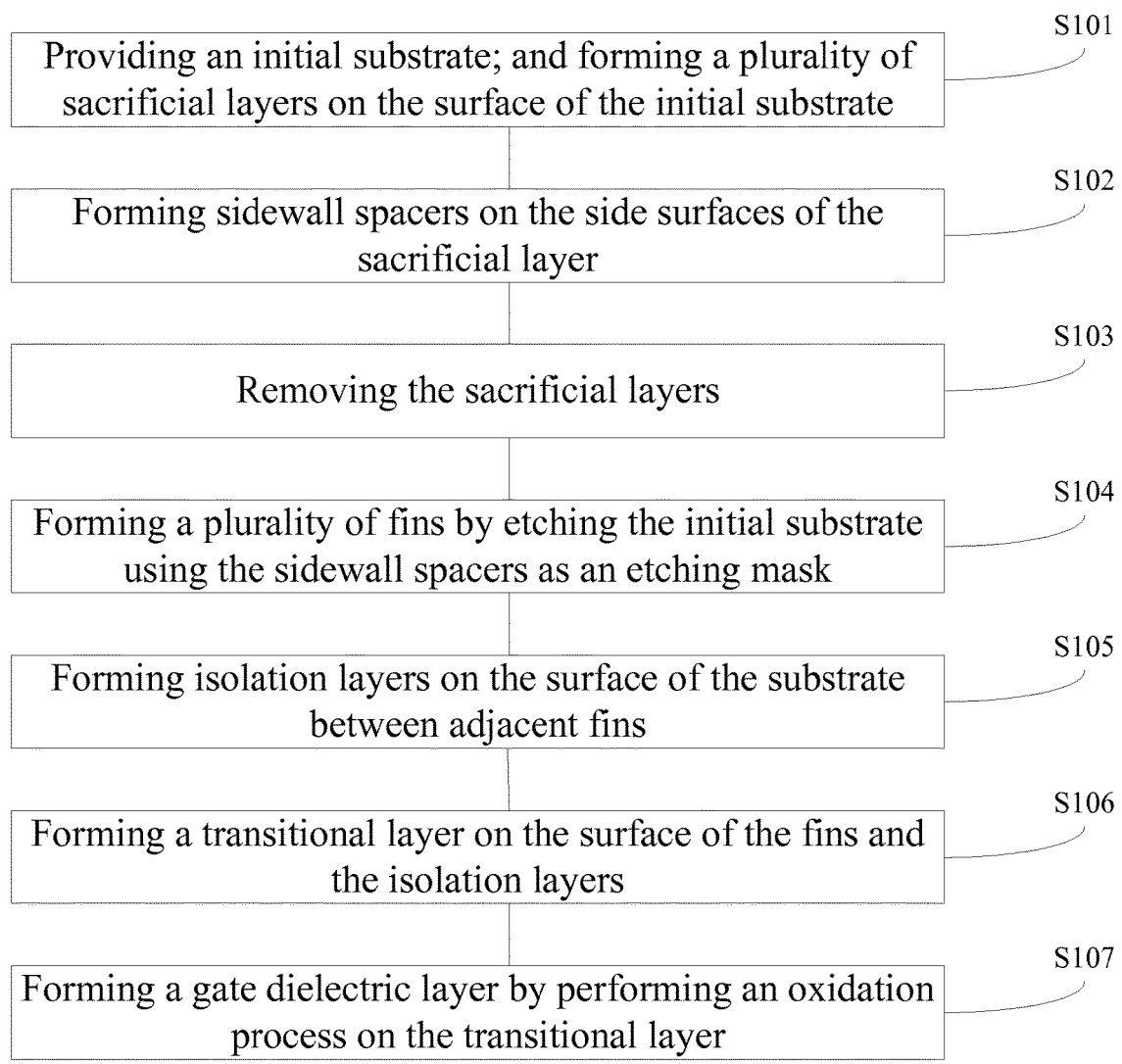
FIG. 10 illustrates an exemplary fabrication method of FinFETs consistent with the disclosed embodiments.

FIG. 10 illustrates an exemplary fabrication method of FinFETs consistent with the disclosed embodiments; and FIGS. 3-9 illustrate semiconductor structures corresponding to certain stages of the exemplary fabrication method of the FinFETs consistent with the disclosed embodiments.

Figure 3:
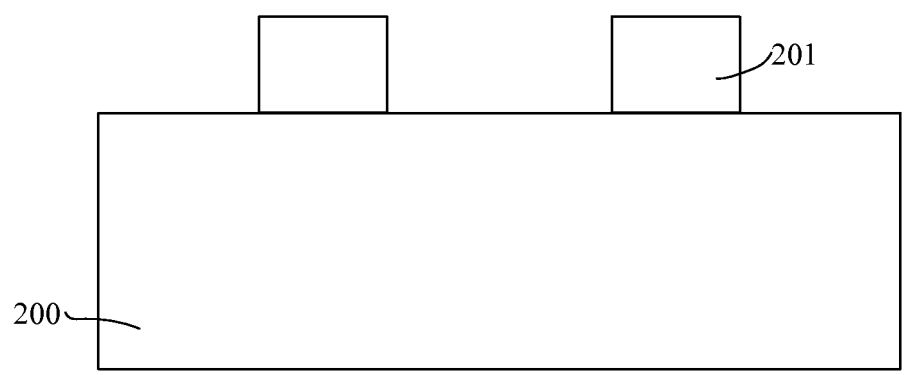
FIGS. 3-9 illustrate semiconductor structures corresponding to certain stages of an exemplary fabrication method of FinFETs consistent with the disclosed embodiments.

As shown in FIG. 10, at the beginning of the fabrication process, an initial substrate with certain structures is provided (S101). FIG. 3 illustrates a corresponding semiconductor structure.

As shown in FIG. 3, an initial substrate 200 is provided, and a plurality of sacrificial layers 201 may be formed on the surface of the initial substrate 200.

The initial substrate 200 may include any appropriate semiconductor materials, such as silicon, silicon on insulator (SOI), silicon germanium, germanium on insulator (GOI), carborundum, indium antimonide, lead telluride, indium arsenide, indium phosphide, gallium arsenidie, gallium nitride, gallium antimonite, alloy semiconductor or a combination thereof. In one embodiment, the initial substrate 200 is silicon. The initial substrate 200 provides a base for subsequent processes and structures.

The sacrificial layers 201 may be made of any appropriate material, such as silicon oxide, photoresist layer, or advanced patterning film (APF), etc. In one embodiment, the sacrificial layers 201 are APFs made of amorphous carbon.

The sacrificial layers 201 may be formed by exposing and developing processes; and followed by an etching process. The width of the sacrificial layers 201 may be limited by the parameters of the exposing and developing process, thus the width of the sacrificial layers 201 may be relatively large. In one embodiment, the width of the sacrificial layers 201 may be in a range of approximately 500 Å~1000 Å.

Figure 4:
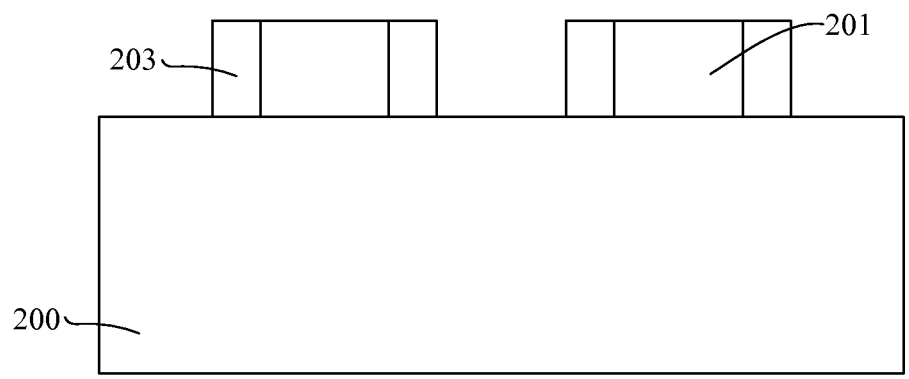

Returning to FIG. 10, after providing the initial substrate 200 with the sacrificial layers 201, sidewall spacers may be formed (S102). FIG. 4 illustrates a corresponding semiconductor structure.

As shown in FIG. 4, sidewall spacers 203 are formed on the side surfaces of the sacrificial layers 201. The sidewall spacers 203 may be used as an etching mask for subsequently etching the initial substrate to form a plurality of fins.

The sidewall spacers 203 may be formed by forming a sidewall spacer film (not shown) on the surface of the initial substrate 200 and the top and side surfaces of the sacrificial layers 203; and followed by an etch back process. Thus, the sidewall spacers 203 may be formed on the side surfaces of the sacrificial layers 203.

The sidewall spacer film may be made of any appropriate material, such as one or more of silicon oxide, silicon nitride, and silicon oxynitride, etc. The sidewall spacers 203 may be a single layer structure, or a multiple-stacked structure. Various processes may be used to form the sidewall spacer film, such as a chemical vapor deposition (CVD) process, a physical vapor deposition (PVD) process, or an atomic layer deposition (ALD) process, etc.

The etch back process may be a dry etching process, a wet etching process, or an ion beam etching process, etc. In one embodiment, a dry etching process is used for the etch back process to etching the sidewall spacer film to form the sidewall spacers 203.

Because the sidewall spacers 203 may be formed by a deposition process and the etch back process, the thickness of the sidewall spacer film may be substantially small, the width of the sidewall spacers 203 may be much smaller than the thickness of the sacrificial layers 201 after the etch back process. When the fins are subsequently formed by etching the initial substrate 200 using the sidewall spacers 203 as an etching mask, the feature size of the fins may be substantially small.

Figure 5:
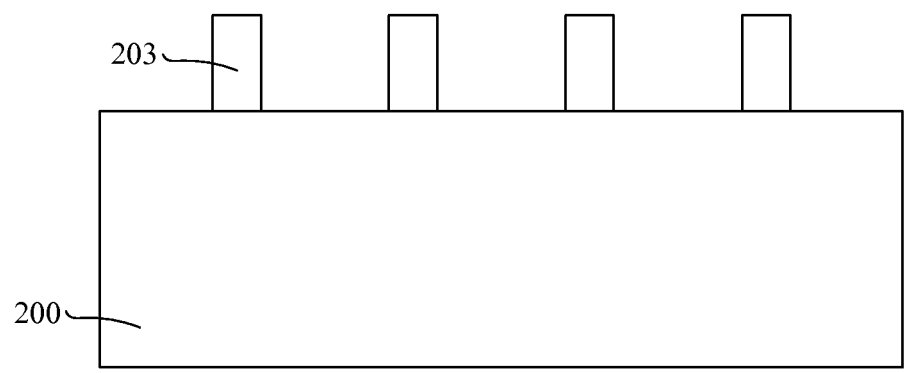

Returning to FIG. 10, after forming the sidewall spacers 203, the sacrificial layers 201 may be removed (S103). FIG. 5 illustrates a corresponding semiconductor structure.

As shown in FIG. 5, the sacrificially layers 201 are removed. The sacrificial layers 201 may be removed by any appropriate process, such as a dry etching process, or a wet etching process, etc. In one embodiment, the sacrificial layers 201 are removed by a dry etching process.

The etching gases of the dry etching process may include HBr and $O_2$, etc. The flow of HBr may be in a range of approximately 100 sccm~500 sccm. The flow of $O_2$ may be in a range of approximately 1 sccm~50 sccm. The pressure of the reaction chamber of the dry etching process may be in a range of approximately 1 mTorr~50 mTorr. The power of the high frequency radio frequency power source of the dry etching process may be in a range of approximately 100 W~500 W. The power of the low frequency radio frequency power source of the dry etching process may be in a range of approximately 0 W~200 W.

Figure 6:
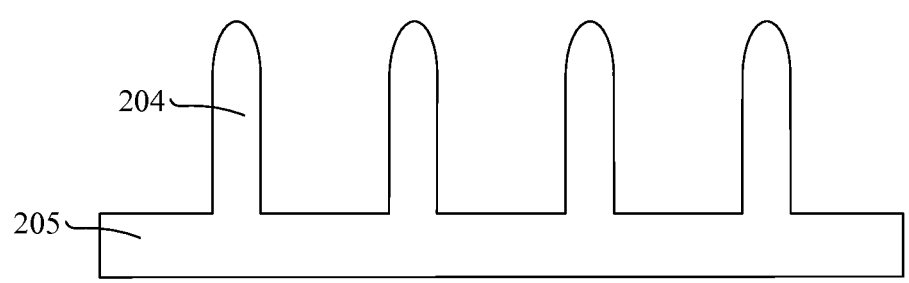

Returning to FIG. 10, after removing the sacrificial layers 201, a plurality of fins may be formed (S104). FIG. 6 illustrates a corresponding semiconductor structure.

As shown in FIG. 6, a plurality of fins 204 are formed on a substrate 205. Further, the sidewall spacers 203 may be removed.

The plurality of the fins 204 may be formed by any appropriate process. In one embodiment, the fins 204 may be formed by etching the initial substrate 200 using the sidewall spacers 203 as an etching mask. After the etching process, the substrate 205 may be formed from the initial substrate 200. In certain other embodiments, the fins may be formed on the initial substrate 200 by any appropriate process, such as a liquid jetting process, or an epitaxial process using a shadow mask, etc. Thus, the initial substrate 200 itself is the substrate 205.

The initial substrate 200 may be etched by any appropriate process, such as a dry etching process, a wet etching process, or an ion beam etching process, etc. In one embodiment, a dry etching process is used to etch the initial substrate 200 to form the fins 204.

The etching gases of the dry etching process may include $Cl_2$ or HBr, etc. The pressure of the reaction chamber of the dry etching process may be in a range of approximately 1 mTorr~50 mTorr. The power of the high frequency radio frequency power source of the dry etching process may be in a range of approximately 150 W~500 W. The power of the low frequency radio frequency power source of the dry etching process may be in a range of approximately 0 W~50 W. The flow of HBr may be in a range of approximately 100 sccm~1000 sccm. The flow of $Cl_2$ may be in a range of approximately 10 sccm~500 sccm.

Various processes may be used to remove the sidewall spacers 203, such as dry etching process, or a wet etching process, etc. In one embodiment, the sidewall spacers 203 are removed by a wet etching process. The etching solution of the wet etching process may be hot phosphoric acid. The mass percentile of the phosphoric acid may be in a range of approximately 65%~85%. The etching temperature may be in a range of approximately 80°~200° C.

In one embodiment, the fins 204 are formed by a double-patterning method such that the feature size of the fins 204 may be substantially small. In certain other embodiments, fins may be formed by providing the initial substrate 200; forming a patterned mask layer on the surface of the initial substrate 200; and followed by etching the initial substrate 200 using the patterned mask layer as an etching mask layer. Thus, a substrate having the fins may be formed.

Referring to FIG. 6, because the position of the top of the fins 204 relative to the etching chamber and the position of the bottom of the fins 204 relative to the etching chamber may be different, the concentration of the etching gases at the top of the fins 204 may be greater than the concentration of the etching gases at the bottom of the fins 204, the apex angles of the top of the fins 204 may be rounded by the etching process.

Figure 7:
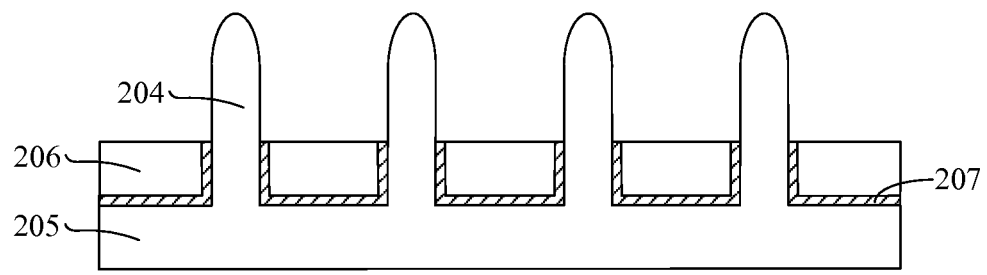

Returning to FIG. 10, after forming the fins 204, isolation layers may be formed (S105). FIG. 7 illustrates a corresponding semiconductor structure.

As shown in FIG. 7, isolation layers 206 are formed on the surface of the substrate 205 between adjacent fins 204. The top surface of the isolation layers 206 may be lower than the top surface of the fins 204. The isolation layers 206 may be subsequently configured as isolation structures of the Fin-FETs to isolate adjacent fins 204. The isolation layers 206 may be made of any appropriate material, such as silicon oxide, or silicon oxynitride, etc.

In one embodiment, a process for forming the isolation layers 206 may include forming an isolation film (not shown) on the surface of the substrate 205 and the surfaces of the fins 204. The top surface of the isolation film may be higher than the top surface of the fins 204. Further, the process may include performing an etch back process. Thus, the isolation film on the top surfaces of the fins 204 may be removed; and the isolation layers 206 may be formed. The top surface of the isolation layers 206 may be lower than the top surfaces of the fins 204.

Various processes may be used to form the isolation film, such as a CVD process, a PVD process, or a flowable CVD (FCVD) process, etc. In one embodiment, an FCVD process is used to form the isolation film. The FCVD process may cause the isolation layer to have a desired filling effect at the corners between the fins 204 and the substrate 205.

Referring to FIG. 7, because the fins 204 may be formed by etching the initial substrate 200, the side surfaces of the fins 204 may be damaged by the etching process. In order to cause the isolation layers 206 to have a significantly dense contact with the side surfaces of the fins 204, in one embodiment, a liner oxide layer 207 may be formed between the isolation layers 206 and the side surfaces of the fins 204. Further, the liner oxide layer 207 may also be formed between the surface of the substrate 205 and the isolation layers 206. The liner oxide layer 207 may provide a desired surface for forming the isolation layers 206.

The liner oxide layer 207 may be made of any appropriate material, such as silicon oxide, silicon oxynitride, etc. In one embodiment, the liner oxide layer 207 is made of silicon oxide.

Various processes may be used to form the liner oxide layer 207, such as a thermal oxidation process, or a chemical oxidation process, etc. In one embodiment, the liner oxide layer 207 is formed by a thermal oxidation process.

Returning to FIG. 10, after forming the isolation layers 206, a transitional layer may be formed (S106). FIG. 8 illustrates a corresponding semiconductor structure.

As shown in FIG. 8, a transitional layer 208 is formed on the top surfaces and the side surfaces of the fins 204. Further, the transitional layer 208 may also be formed on the surface of the isolation layers 206 formed between the adjacent fins 204.

The transitional layer 208 may be made of a material having hatoms identical to that of the fins 204. For example, when the fins 204 are made of silicon, the material for the transitional layer 208 may also consist of silicon atoms. Thus, the transitional layer 208 may provide silicon atoms to the subsequently formed gate dielectric layer such that the consumption of the material of fins 204 for subsequently forming the gate dielectric layer may be reduced. Further, when the transitional layer 208 is subsequently oxidized, the oxidation process may also oxidize the fins 204. Because the transitional layer 208 is formed on the side surfaces and the bottom surfaces of the fins 204, the oxidation rate of the fins 204 may be relatively low. By reducing the oxidation rate of the fins 204, the consumption of the material of the fins 204 may be further reduced.

The transitional layer 208 may be made of any appropriate material, such as silicon nitride, or silicon oxynitrde, etc. In one embodiment, the transitional layer is made of silicon nitride; the possible oxygen source in the process for forming the transitional layer 208 may be avoided. Thus, the oxidation to the material of the fins 204 caused by the fabrication process of the transitional layer 208 may be avoided; and the further consumption of the material of the fins 204 may be avoided as well.

The transitional layer 208 may be deposited on the side surfaces and top surfaces of the fins 204, there may be some defects in the interface between the transitional layer 208 and the fins 204 because of the limitation of the deposition processes. If the thickness of the transitional layer 208 is significantly large, or equal to the subsequently formed gate dielectric layer, the subsequently formed gate dielectric layer may be formed by only oxidizing the transitional layer 208, the defects in the interface between the gate dielectric layer and the fins 204 may still exist. The defects may affect the electrical properties of the FinFETs. For example, it may be easy to form current leakage, and/or voltage breakdown, etc.

Therefore, in one embodiment, the thickness of the transitional layer 208 may be smaller than the thickness of the subsequently formed gate dielectric layer. When the transitional layer 208 is subsequently oxidized, a surface portion of the fins 204 may also be oxidized, thus a portion of the gate dielectric layer at the interface between the gate dielectric layer and the fins 204 may be formed by oxidizing the material of the fins 204. Such a portion of the gate dielectric layer may have a desired interface with the fins 204, thus the electrical properties of the FinFET may be improved.

If the transitional layer 208 is substantially thin, when an oxidation process is subsequently used to form the gate dielectric layer, in order to form the gate dielectric layer with a pre-determined thickness, the oxidation process may oxidize a significantly thick portion of the fins 204, thus the consumption of the material of the fins 204 may be significantly large, the completeness of the size of the fins 204 may be affected. If the transitional layer 208 is significantly thick, the transitional layer 208 may not be completely oxidized by the subsequent oxidation process. After forming the gate dielectric layer, a portion of the transitional layer 208 may not be oxidized, thus the electrical properties of the FinFETs may also be affected.

In one embodiment, the thickness of the transitional layer 208 may be in a range of approximately 5 Å~0 Å. In certain other embodiments, the thickness of the transitional layer 208 may other appropriate values determined according to the practical requirements.

Various processes may be used to form the transitional layer 208, such as a CVD process, a PVD process, an FCVD process, or an atomic layer deposition (ALD) process, etc. When a deposition process is used to form the transitional layer 208, the deposition process may barely oxidize the fins 208, thus the material of the fins 204 may not be consumed during the deposition process of the transitional layer 208.

With the continuously shrinking of the semiconductor devices, the thickness of the transitional layer 208 may become smaller and smaller; and it may require the subsequently formed gate dielectric layer to have a desired thickness uniformity. Thus, it may require the transitional layer 208 to have a significantly high thickness uniformity under the condition that the thickness of the transitional layer 208 is thin enough to match the design requirements. Thus, in one embodiment, the transitional layer 208 is formed by an ALD process. The deposition temperature of the ALD process may be relatively low; and the crystal orientation selectivity of the ALD process may be substantially low. Specifically, the crystal orientation of the top surface of the fins 204 may be [110], the crystal orientation of the side surfaces of the fins 204 may be [111], and the deposition rates of the ALD process on the surfaces with such two crystal orientations may be similar. Thus, the thickness of the transitional layer 208 on the side surfaces of the fins 204 and the thickness of the transitional layer 208 on the top surfaces of the fins 204 may be identical; and the thickness of the transitional layer 208 may be uniform. That is, the ALD process may be very conformal. Thus, the desired thickness uniformity of the transitional layer 208 may improve the thickness uniformity of the subsequently formed gate dielectric layer.

In one embodiment, the transitional layer 208 is made of silicon nitride. The source gas of the ALD process for forming the transitional layer 208 may include a silicon source gas and a nitrogen source gas. The silicon source gas may be $SiH_2Cl_2$, $SiH_4$, $SiH_3Cl$, or $Si_2H_6$, etc. The nitrogen source gas may be $NH_3$. The flow of the silicon source gas may be in a range of approximately 5 sccm~5000 sccm. The flow of the nitrogen source gas may be in a range of approximately 5 sccm~5000 sccm. The pressure of the reaction chamber of the ALD process may be in a range of approximately 0.1 Torr~100 Torr. The temperature of the reaction chamber may be in a range of approximately 200° C.~700° C.

Returning to FIG. 10, after forming the transitional layer 208, the transitional layer 208 may be oxidized to form a gate dielectric layer (S107). FIG. 9 illustrates a corresponding semiconductor structure.

As shown in FIG. 9, the transitional layer 208 is oxidized by an oxidation process; and a gate dielectric layer 209 is formed on the side surfaces and the top surfaces of the fins 204. In one embodiment, the gate dielectric layer 209 is made of silicon oxide. In certain other embodiments, the gate dielectric layer 209 may be other appropriate oxide material corresponding to the material of the fins 204 and the transitional layer 208.

In one embodiment, the thickness of the transitional layer 208 is smaller than the thickness of the gate dielectric layer 209. That is, a surface portion of the fins 204 may be oxidized by the oxidation process. Thus, the gate dielectric layer 209 may consist of a portion converted from the transitional layer 208 and a portion converted from the fins 204. Therefore, during the process for forming the gate dielectric layer 209, the excess consumption of the fins 204 may be avoided.

In one embodiment, the thickness of the transitional layer 208 may be approximately 20 Å, and the thickness of the gate dielectric layer 209 may be approximately 30 Å. A portion of the gate dielectric layer 209 with a thickness of approximately 20 Å may be converted from the transitional layer 208 after the oxidation process. Thus, it may need the other portion of the gate dielectric layer 209 with a thickness of approximately 10 Å to be converted from the fins 204. According to the principle that forming one unit silicon oxide may need 0.45 unit silicon, it may need the surface portion of fins 204 with a thickness of 4.5 Å to be consumed to form the portion of the gate dielectric layer 209 with a thickness of the 10 Å. While the process described in FIGS. 1-2 may need the surface portion of fins 102 with 13.5 Å to form the gate dielectric layer 103 with a thickness of the 30 Å, thus the consumption of the fins 204 may be significantly reduced. Therefore, the size change of the fins 204 after forming the gate dielectric layer 209 may be substantially small; and the electrical properties of the FinFETs may be improved. In one embodiment, the thickness of the transitional layer 208 is in a range of approximately 5 Å~40 Å; and the thickness of the gate dielectric layer 209 10 Å~60 Å.

Referring to FIG. 9, in one embodiment, when the transitional layer 208 is oxidized, a portion of the fins 204 may also be oxidized. Thus, the gate dielectric layer 209 at the interface between the gate dielectric layer 209 and the fins 204 may be formed by oxidizing the fins 204. Therefore, the gate dielectric layer 209 and the fins 204 may have desired interface properties; the electrical properties of the FinFETs may be improved; and the current leakage and/or voltage breakdown problems may be solved.

Because the transitional layer 208 may be formed on the surface of the fins 208, the oxidation rate of the oxidation process to the material of the fins 204 may be reduced due to the barrier effect the transitional layer 208, the consumption of the material of the fins 204 may be further reduced. Further, because the transitional layer 208 may have a desired thickness uniformity, the uniformity of the gate dielectric layer 209 formed by oxidizing the transitional layer 208 may also match the designed requirement. Thus, the electrical properties of the FinFETs may be further improved.

Various processes may be used to convert the transitional layer 208 into the gate dielectric layer 209. Because when the transitional layer 208 is converted into the gate dielectric layer 209, it may not only need to oxidize the transitional layer 208, it may also need to oxidize a surface portion of the fins 204; an oxidation process with a significantly strong oxidation ability may be needed. In one embodiment an ISSG oxidation process is used to oxidize the transitional layer 208 and the surface portion of the fins 204 to form the gate dielectric layer 209.

In one embodiment, the reaction gases of the ISSG oxidation process may include $H_2$, $O_2$, or $N_2O$, etc. The flow of $H_2$ may be in a range of approximately 10 sccm~1000 sccm. The flow of the $O_2$ or $N_2O$ may be in a range of approximately 20 sccm~2000 sccm. The pressure of the reaction chamber of the ISSG oxidation process may be in a range of approximately 1 Torr~50 Torr. The temperature of the reaction chamber may be in a range of approximately 450° C.~1100° C.

After forming the gate dielectric layer 209, a gate electrode layer (not shown) may be formed on the surface of the gate dielectric layer 209; and doping regions (not shown) may be formed in the fins at both sides of the fins 204.

Thus, a FinFET may be formed by the above disclosed processes and methods; and the corresponding structure is illustrated in FIG. 9. As shown in FIG. 9, the FinFET includes a substrate 205. The FinFET also includes a fin 204. Further, the FinFET includes a liner oxide layer 207 formed on the surface of the substrate 205 at both sides of the fin 204 and isolation layers 206 formed on the surface of the liner oxide layer 207. Further, the FinFET also includes a gate dielectric layer 209 formed by oxidizing a transitional layer and a surface portion of the fin 204 formed on the surface of the fin 204. Further, the FinFET also includes a gate electrode layer (not shown) formed on the surface of the gate dielectric layer 209 and doping regions (not shown) formed in the fin 204 at both sides of the gate electrode layer. The detailed structures and intermediate structures are described above with respect to the fabrication processes.

In one embodiment, the transitional layer may be formed on the side and top surfaces of the fins by a deposition process; and the transitional layer may contain atoms identical to the atoms of the fins. Then, the gate dielectric layer may be formed on the top and side surfaces of the fins by oxidizing the transitional layer and a surface portion of the fins. Because, the gate dielectric layer may be mainly formed from the transitional layer; and the deposition process may barely consume the material of the fins, the consumption of the material of the fins may be significantly reduced. Therefore, the size of the fins may not have a significant change after forming the gate dielectric layer; and the electrical properties of the FinFETs may be improved.

Further, the thickness of the transitional layer may be smaller than the thickness of the gate dielectric layer. That is, when the transitional layer is oxidized, a surface portion of the fins may also be oxidized, thus the gate dielectric layer at the interface between the fins the gate dielectric layer may be formed by oxidizing the surface portion of the fins. Therefore, the gate dielectric layer and the fins may have a desired interface; the current leakage issue and/or the voltage breakdown issue may be prevented; and the electrical properties and the reliability of the FinFETs may be improved.

Further, the transitional layer may be formed by an ALD process. The ALD process may have a substantially small selectivity to the crystal orientation, thus the thickness of the transitional layer on the top surfaces of the fins may be identical to the thickness of the transitional layer on the side surfaces of the fins; and the transitional layer may be significantly uniform. Therefore, the gate dielectric layer formed by oxidizing the transitional layer may also be significantly uniform; and the issue that the thickness of the gate dielectric layer on the top surfaces of the fins is smaller than the thickness of the gate dielectric layer on the side surfaces of the fins may be avoided; and the electrical properties of the FinFETs may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A fin field-effect transistor, comprising:
   a substrate;
   a fin formed on a surface of the substrate;
   a liner oxide layer formed on the surface of the substrate at both sides of the fin;
   an isolation layer formed on a surface of the liner oxide layer;
   a gate dielectric layer formed by oxidizing a transitional layer and oxidizing a surface portion of the fin formed on the surface of the substrate wherein the transitional layer at least has atoms identical to atoms of the fin, on a side and top surface of the fin and a top surface of the isolation layer, wherein the isolation layer is surrounded by the liner oxide layer and the gate dielectric layer, a thickness of the transitional layer is smaller than a thickness of the gate dielectric layer, the thickness of the transitional layer is in a range of approximately 5 Å~40 Å, and the thickness of the gate dielectric layer is in a range of approximately 10 Å~60 Å;
   a gate electrode layer formed on a surface of the gate dielectric layer; and
   doping regions formed in the fin at both sides of the gate electrode layer.

2. The fin field-effect transistor according to claim 1, wherein:
   the transitional layer is made of silicon nitride; and
   the gate dielectric layer is made of silicon oxide.

3. The fin field-effect transistor according to claim 2, wherein:
   the transitional layer is formed by an atomic layer deposition process; and
   the gate dielectric layer is formed by an in situ steam generation process.

4. The fin field-effect transistor according to claim 2, wherein:
   the liner layer contacts the gate dielectric layer on the side surface of the fin.

5. The fin field-effect transistor according to claim 1, wherein:
   the fins are made of silicon.

6. The fin field-effect transistor according to claim 1, wherein:
   the transitional layer is formed by an atomic layer deposition process.

7. The fin field-effect transistor according to claim 1, wherein:
   the substrate includes silicon, silicon on insulator, silicon germanium, germanium on insulator, carborundum, indium antimonide, lead telluride, indium arsenide, indium phosphide, gallium arsenidie, gallium nitride, gallium antimonite, or a combination thereof.

8. The fin field-effect transistor according to claim 1, wherein:
   each of the plurality of fin has a rounded apex angle.

9. A fin field-effect transistor, comprising:
a substrate;
a plurality of fins protruding from a surface of the substrate;
a plurality of isolation layers on the surface of the substrate between adjacent fins;
a gate dielectric material layer including a converted transitional layer, the gate dielectric material layer being formed by oxidizing a transitional layer and oxidizing a surface portion of the fin formed on the surface of the substrate, wherein:
the converted transitional layer at least has atoms identical to atoms of the plurality of fins and is on side and top surfaces of the plurality of fins and on the plurality of isolation layers, and a thickness of the transitional layer is smaller than a thickness of the gate dielectric material layer, wherein the isolation layer is surrounded by a liner oxide layer and the gate dielectric material layer, the thickness of the transitional layer is in a range of approximately 5 Å~40 Å, and the thickness of the gate dielectric layer is in a range of approximately 10 Å~60 Å.

10. The fin field-effect transistor according to claim 9, wherein:
the plurality of fins are made of silicon.

11. The fin field-effect transistor according to claim 9, wherein:
the transitional layer is made of silicon nitride.

12. The fin field-effect transistor according to claim 9, wherein:
the gate dielectric material layer is made of silicon oxide.

13. The fin field-effect transistor according to claim 9, further including:
a gate electrode layer on a surface of the gate dielectric material layer, wherein the gate dielectric material layer is used as a gate dielectric layer; and
doping regions in the fins at both sides of the gate electrode layer.

14. The fin field-effect transistor according to claim 9, wherein:
the top surface of the plurality of isolation layers is lower than the plurality of fins.

15. The fin field-effect transistor according to claim 9, wherein:
the substrate includes silicon, silicon on insulator, silicon germanium, germanium on insulator, carborundum, indium antimonide, lead telluride, indium arsenide, indium phosphide, gallium arsenidie, gallium nitride, gallium antimonite, or a combination thereof.

16. The fin field-effect transistor according to claim 9, wherein:
each of the plurality of fin has a rounded apex angle.

17. The fin field-effect transistor according to claim 9, further wherein:
the liner layer is on the plurality of fins and on the surface of the substrate between adjacent fins, wherein the plurality of isolation layers is on the liner layer.

18. The fin field-effect transistor according to claim 17, wherein:
the liner layer covers a lower portion of the side surfaces of the plurality of fins.

* * * * *